United States Patent [19]

Cogan

[11] Patent Number: 4,716,126
[45] Date of Patent: Dec. 29, 1987

[54] FABRICATION OF DOUBLE DIFFUSED METAL OXIDE SEMICONDUCTOR TRANSISTOR

[75] Inventor: Adrian I. Cogan, San Jose, Calif.

[73] Assignee: Siliconix Incorporated, Santa Clara, Calif.

[21] Appl. No.: 871,006

[22] Filed: Jun. 5, 1986

[51] Int. Cl.[4] .................. H01L 21/265; H01L 21/316
[52] U.S. Cl. ....................................... 437/24; 437/29; 437/69; 437/41
[58] Field of Search ...................... 29/571, 578, 576 B, 29/580; 357/23.1, 23.4; 148/188, 187; 437/24, 29, 41, 69

[56] References Cited

U.S. PATENT DOCUMENTS

| | | | |
|---|---|---|---|
| 4,417,385 | 11/1983 | Temple | 29/571 |
| 4,430,792 | 2/1984 | Temple | 29/571 |
| 4,443,931 | 4/1984 | Baliga et al. | 29/571 |
| 4,466,176 | 8/1984 | Temple | 29/571 |
| 4,567,641 | 2/1986 | Baliga et al. | 29/571 |
| 4,644,637 | 2/1987 | Temple | 29/571 |

Primary Examiner—Brian E. Hearn
Assistant Examiner—T. N. Quach
Attorney, Agent, or Firm—Nathan N. Kallman; Alan H. MacPherson

[57] ABSTRACT

In the fabrication process of a DMOS transistor, a window is formed between polysilicon gate regions. Nitrogen is then implanted in the window. A self-aligning oxide is deposited to cover the exposed side walls of the polysilicon gate regions. P-type impurities are implanted at the exposed surface of the window between the side walls. Using silicon nitride masking, an oxide plug is then grown in the window. N-type impurities are implanted in the window region to form a junction adjacent to the polysilicon gate regions. Metal contacts and a passivation layer are subsequently deposited by masking, and contact windows are formed to complete the transistor structure.

4 Claims, 7 Drawing Figures

FABRICATION OF DOUBLE DIFFUSED METAL OXIDE SEMICONDUCTOR TRANSISTOR

BACKGROUND OF THE INVENTION

1. Field of the Invention

This invention relates to a method of fabricating a semiconductor device and in particular to a process of manufacturing a double diffused metal oxide semiconductor (DMOS) transistor.

2. Description of the Prior Art

The tendency of the semiconductor technology is to make power semiconductor devices more compact and with higher density. To this end, it has been found necessary to provide critical alignments of very small dimensional geometries of the conductive regions of the device. Therefore, additional masking steps with critical tight specifications have been used, thereby adding to the time and expense of manufacture, as well as reducing the yield if tight dimensional tolerances are not substantially met. In the manufacture of DMOS transistors, for example, six or more masking steps are required in order to satisfy the high resolution requirements.

SUMMARY

An object of this invention is to provide a simplified and relatively inexpensive process for fabricating metal oxide semiconductor transistors having self alignment features.

Another object of this invention is to provide a process for fabricating high density DMOS transistors in which high resolution masking steps are eliminated.

In accordance with this invention, a process for fabricating DMOS transistors eliminates critical alignment masking steps by producing a self aligning oxide on the side walls of the polysilicon gate regions thereby delineating the polysilicon gates and precluding electrical shorting.

BRIEF DESCRIPTION OF THE DRAWING

The invention will be described in greater detail with reference to the drawing in which.

DETAILED DESCRIPTION

Figure 1A:
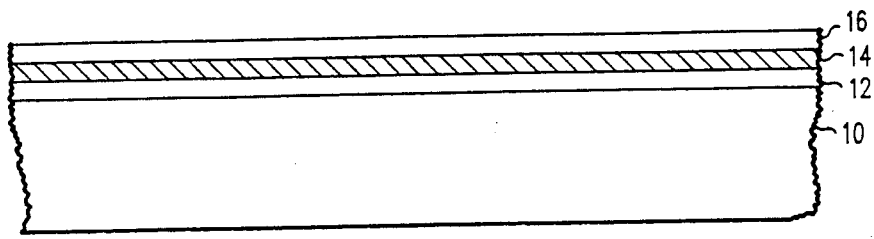
FIGS. 1a–1g are cross-sectional views, partly broken away, illustrating the sequence of steps of the process for fabricating a DMOS transistor, in accordance with this invention.

With reference to the drawing, FIG. 1a depicts a portion of a DMOS semiconductor device including a substrate or wafer 10 made of monocrystalline silicon semiconductor material. The silicon substrate is a highly doped N+ conductivity type and is characterized by a resistivity of about 0.5–50 ohm centimeters. A thin film 12 of gate oxide formed from silicon dioxide is grown or deposited on the substrate and a layer 14 of crystalline polysilicon is formed over the gate oxide followed by a thermally grown or deposited layer 16 of silicon dioxide. In a preferred embodiment, the thicknesses of the film 12 and layers 14 and 16 are about 100 nanometers, 500 nanometers and 500 nanometers, respectively.

Figure 1B:
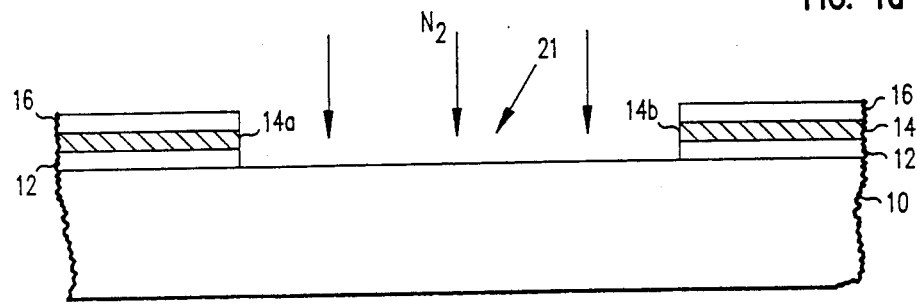

As shown in FIG. 1b, the polysilicon gate regions 14a and 14b are defined in a first masking step by etching the polysilicon layer 14 and the oxide layers 16 and 12 to open a window 21 between the polysilicon gate regions 14A and 14B. Etching can be implemented by well known processes, such as wet chemical etching, or dry etching by RF sputtering or reactive ion etching, by way of example. After etching to delineate the polysilicon gate regions, nitrogen is implanted utilizing an energy of about 200K electron volts so that the implant dosage will be in the range of $5 \times 10^{15}$ to $5 \times 10^{16}$ ions per square centimeter. The structure is subjected to a high temperature anneal cycle at a temperature of about 950°–1050° C. for about $\frac{1}{2}$ to $1\frac{1}{2}$ hours. As a result, the nitrogen implant becomes an oxidation retardant or inhibitor for silicon.

Figure 1C:
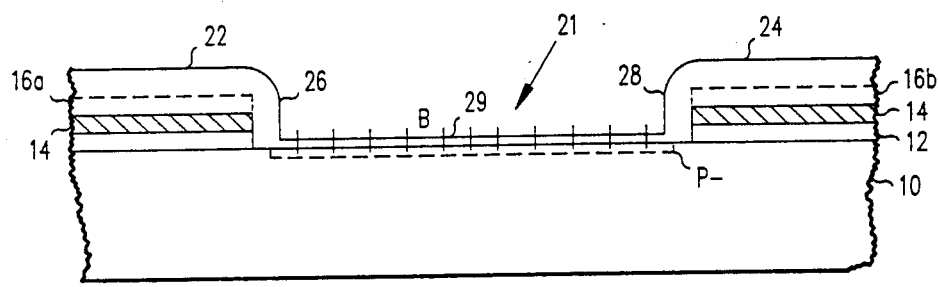

As illustrated in FIG. 1c, silicon oxide layers 22 and 24 are grown on the surface of the polysilicon regions 14A and 14B and over the thermally grown oxide regions 16A and 16B during a wet oxidation cycle. The oxide is grown at a temperature of about 900° C. for about 30 minutes to a thickness of about 500 nanometers. Since implanted nitrogen is present at the exposed horizontal silicon surface of the window portion 21, growth of silicon dioxide is inhibited in that region, while silicon oxide grows on the vertical side walls 26 and 28 of the polysilicon gate regions. At the end of the oxidation cycle, a relatively thick oxide layer of about 500 nanometers is formed on each side wall of the polysilicon gate regions, and a very thin oxide pad 29 is grown on the exposed horizontal surface of the window region 21.

The steps disclosed with reference to FIGS. 1b and 1c provide a self-alignment of the oxide coated side walls and precludes the need for precise delineation and alignment of the polysilicon regions, thereby eliminating the requirement for a critical polysilicon-to-contact masking step.

Following the oxidation cycle to form the oxide side walls 26 and 28, a P-type impurity, such as boron, is implanted using a dosage of $10^{13}$ to $10^{15}$ ions per square centimeter at an implant energy of about 50–100K electron volts to form the P- body region, as illustrated in FIG. 1c.

Figure 1D:
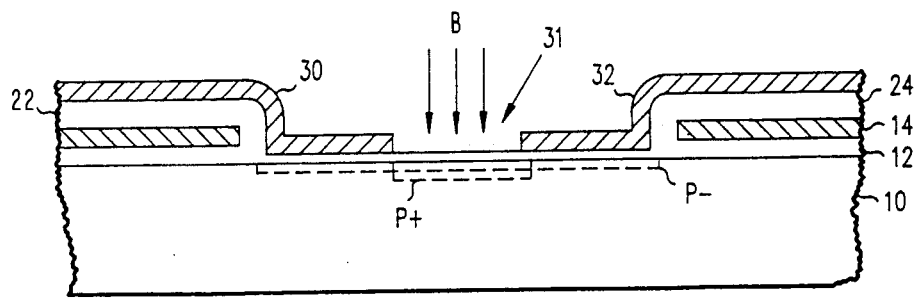

With reference to FIG. 1d, an oxidation mask of silicon nitride is deposited over the oxide regions 22 and 24 and is patterned into regions 30 and 32 by a second masking step to define a narrow window 31. This alignment step does not require tight tolerances and is implemented by well known conventional techniques. A P-type impurity, boron for example, is implanted at a dosage of about $10^{14}$ to $10^{16}$ ions per square centimeter at approximately 50K electron volts to produce a P+ region in the area below the narrow window 31.

Figure 1E:
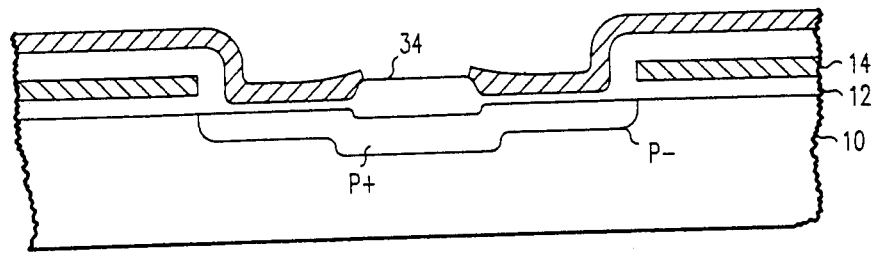

As shown in FIG. 1e, a localized oxide plug 34 is grown in the narrow window region 31 over the P+ region during a drive-in diffusion and oxidation cycle. The P+ and P− regions are diffused further into the silicon semiconductor material 10 as shown in FIG. 1e.

Figure 1F:
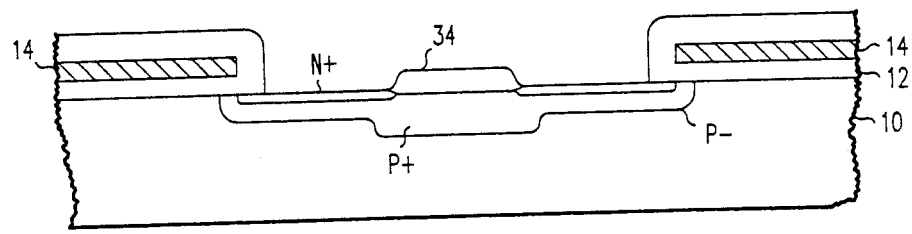
Figure 1G:
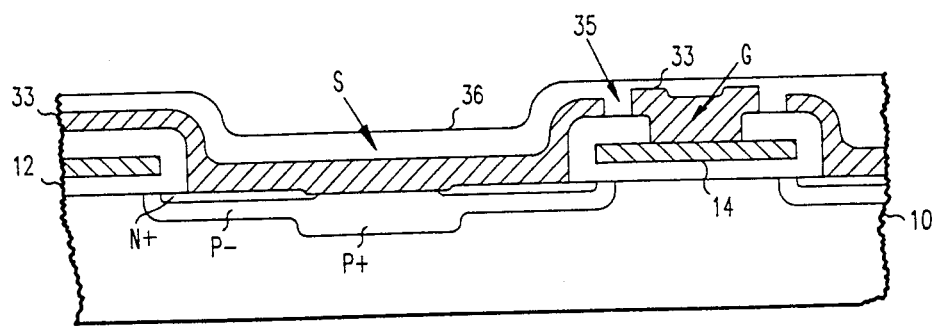

In the next step of the process, an N-type impurity, such as arsenic, is implanted, but does not affect the P+ region beneath the plug area. An anneal cycle activates the N+ type dopant and provides a lateral diffusion of the N type material, as demonstrated by FIG. 1f. An N+ source region is developed and forms a shallow junction; about 0.5 micron to 1.0 micron deep, reaching under the end portions of the polysilicon gate regions.

In order to establish the necessary gate contact and source contact, a contact mask M3 is used to open access to the polysilicon gate and to define the metal contact regions 33. A gap 35 is provided between the metal contacts to the gate region and the source region.

The mask M3 enables also the removal of the oxide plug 34. The masking step using mask M3 is not critical for alignment of the metal contact regions. After the masking step utilizing the third mask M3, a fourth mask M4 is employed for patterning of the metal to which the electrical leads will be attached. To complete the process, a passivation layer 36 is deposited over the structure, and contact windows or bonding pads are opened through the structure to the polysilicon gate regions, using a fifth and final mask M5.

The processing sequence disclosed herein uses five masking steps, whereby no critical alignments are needed by virtue of creating a self-aligned side wall oxide on the polysilicon gate.

The invention is not limited to the specific parameters set forth above, but the layer thicknesses, resistance values, impurity concentrations, input energies, temperatures and times of each process step can be modified within the scope of the invention.

Also, the novel fabrication process is applicable to both n-channel and p-channel transistors, by switching from p to n and n to p layers throughout the source.

I claim:

1. A process for fabricating a double diffused metal oxide semiconductor transistor structure comprising the steps of:
   sequentially forming on a silicon substrate a thin film of gate oxide, a layer of polysilicon, and a first layer of thermally grown oxide;
   etching a window through said layers and said thin film whereby said polysilicon layer is configured into gate regions having side walls and a window between said gate regions;
   implanting nitrogen in said semiconductor substrate window region for forming an oxidation inhibitor to silicon;
   thermally growing a second layer of silicon oxide over said side walls of said gate regions and over said window forming thereby a thin oxide pad over said window;
   implanting P-type impurity material below said window;
   forming silicon nitride over said second layer of thermally grown silicon oxide and patterning by masking and etching said silicon nitride to form spaced regions that define a narrow window therebetween;
   implanting P+ type impurity material through said narrow window between said gate regions;
   growing a localized oxide plug over said implanted P+ region by a drive-in diffusion and oxidation cycle;
   implanting N-type material to form a junction adjacent to said gate region; and
   opening access to said gate regions for defining metal contact regions.

2. A process as in claim 1, including the step of depositing a passivation layer over said structure.

3. A process as in claim 1, wherein only five masking steps are employed.

4. A process as in claim 1, including the step of forming a metallization pattern to which electrical leads are coupled.

* * * * *